United States Patent
McCulloh et al.

(10) Patent No.: US 7,884,023 B1
(45) Date of Patent: Feb. 8, 2011

(54) SYSTEM AND METHOD FOR USING SILICIDING PECVD SILICON NITRIDE AS A DIELECTRIC ANTI-REFLECTIVE COATING AND HARD MASK

(75) Inventors: Heather E. McCulloh, Kennebunk, ME (US); Patrick McCarthy, Hollis, ME (US); Steven J. Adler, Cape Elizabeth, ME (US); Henry G. Prosack, Jr., Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 663 days.

(21) Appl. No.: 11/224,150

(22) Filed: Sep. 12, 2005

(51) Int. Cl.
*H01L 21/302* (2006.01)
*H01L 21/461* (2006.01)

(52) U.S. Cl. .................. 438/706; 438/275; 438/478; 438/738; 438/151

(58) Field of Classification Search .................. 438/706, 438/275, 478, 738, 151, 755
See application file for complete search history.

(56) References Cited

U.S. PATENT DOCUMENTS

| | | |
|---|---|---|
| 5,302,539 A | 4/1994 | Haken et al. |
| 5,443,996 A | 8/1995 | Lee et al. |
| 5,451,545 A | 9/1995 | Ramaswami et al. |
| 5,639,687 A * | 6/1997 | Roman et al. .................. 438/69 |
| 6,395,644 B1 * | 5/2002 | Hopper et al. ............... 438/738 |
| 6,429,124 B1 | 8/2002 | Tang et al. |
| 6,479,402 B1 * | 11/2002 | Yang et al. ................... 438/763 |
| 6,693,025 B2 | 2/2004 | Tang et al. |
| 6,864,143 B1 | 3/2005 | Shue et al. |
| 6,872,612 B2 | 3/2005 | Hanson et al. |
| 6,909,132 B2 * | 6/2005 | Yoshihara et al. ........... 257/296 |
| 2006/0154487 A1 * | 7/2006 | Wang et al. .................. 438/714 |
| 2006/0234434 A1 * | 10/2006 | Filipiak ....................... 438/197 |

OTHER PUBLICATIONS

Seung-Soo Han et al. (IEEE transactions on Semiconductor Manufacturing, vol. 9, No. 3, 1996 pp. 303-311).*
S. Wolf and R.N. Tauber, (Silicon Processing for the VLSI Era, vol. 1—Process Technology, Lattice Press, 1986, pp. 191-195).*
Chris Bencher et al., "Enhanced Poly Gate Critical Dimension Control by Using a SiOxNy ARC Film", SPIE vol. 3183, pp. 255-262.
Yanwen Zhang et al., "Annealing Behaviour of Foreign Atom Incorporated Co-Silicides Formed by MEVVA Implantation Into SiO2/Si and Si3N4/Si Structures", Nuclear Instruments and Methods in Physics Research B 175-177 (2001) pp. 737-743.

* cited by examiner

*Primary Examiner*—Shamim Ahmed
*Assistant Examiner*—Mahmoud Dahimene (57) ABSTRACT

An electronic apparatus is disclosed that comprises a silicon nitride material that has an increased silicon content. The silicon nitride material is manufactured by exposing plasma enhanced chemical vapor deposition (PECVD) silicon nitride to an increased flow of silane while the PECVD silicon nitride is being deposited. The material has anti-reflective coating (ARC) properties and can also be used as a hard mask. When the material is covered with cobalt the material forms conductive cobalt silicide when the cobalt is annealed. A method for siliciding the PECVD silicon nitride is also disclosed.

20 Claims, 8 Drawing Sheets

SYSTEM AND METHOD FOR USING SILICIDING PECVD SILICON NITRIDE AS A DIELECTRIC ANTI-REFLECTIVE COATING AND HARD MASK

TECHNICAL FIELD OF THE INVENTION

The present invention is generally directed to manufacturing technology for semiconductor devices and, in particular, to a system and method for using siliciding PECVD silicon nitride as a dielectric anti-reflective coating (ARC) and as a hard mask.

BACKGROUND OF THE INVENTION

In the manufacture of integrated circuits it has become common to employ anti-reflection coating (ARC) techniques to improve the control of critical dimension (CD) tolerances. Typically a layer of ARC material is formed between a substrate and a layer of photoresist. The layer of ARC material is a dielectric material that eliminates reflections of incident light from the surface of the substrate from affecting the critical dimension of patterned photoresist lines.

The ARC technique utilizes (1) a phase shift cancellation of the reflections from the interface between the bottom of the photoresist layer and the top of the layer of ARC material, and (2) a phase shift cancellation of the reflections from the interface between the bottom layer of ARC material and the top surface of the substrate. The layer of ARC material is designed so that its optical properties and thickness (1) create a phase shift equal to one half of a wavelength of the incident light, and (2) cause the reflections to be equal in intensity so that the cancellation of the reflections will occur.

Prior art anti-reflecting coating (ARC) material is typically made from silicon oxy-nitride (SiOxNy) material. The prior art ARC material must be removed after the photolithography procedures are completed. This is because the presence of the ARC material would impede the formation of cobalt silicide in subsequent processing steps.

It would be advantageous in integrated circuit manufacturing to have a material that has anti-reflecting coating (ARC) properties that does not need to be removed before subsequent processing steps are performed. It would also be advantageous to have a material for a hard mask for a silicon etch process that does not have to be removed before subsequent processing steps are performed.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 17, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged electronic device.

The present invention provides a method for increasing the silicon content of a plasma enhanced chemical vapor deposition (PECVD) silicon nitride (SiN). Sufficient silicon is added to the plasma enhanced chemical vapor deposition (PECVD) silicon nitride (SiN) so that it will form conductive cobalt silicide ($CoSi_2$) under typical annealing conditions. A film of silicon enhanced plasma enhanced chemical vapor deposition (PECVD) silicon nitride (SiN) (referred to as "plasma nitride") may be used as a dielectric anti-reflective coating (ARC) for the photolithography of polysilicon (referred to as "poly").

After the poly has been patterned the plasma nitride film does not need to be removed for further processing steps to take place. Cobalt is deposited over the plasma nitride film and annealed. The annealing process causes the plasma nitride film to form cobalt silicide ($CoSi_2$). The cobalt silicide ($CoSi_2$) material can then be used as an etch stop layer for tungsten contacts. The method of the present invention possesses a significant advantage in that the plasma nitride layer (which becomes the cobalt silicide) layer does not need to be removed.

FIGS. 1 through 5 illustrate exemplary stages of manufacture of an embodiment of electronic device manufactured in accordance with the principles of the present invention.

Figure 1:
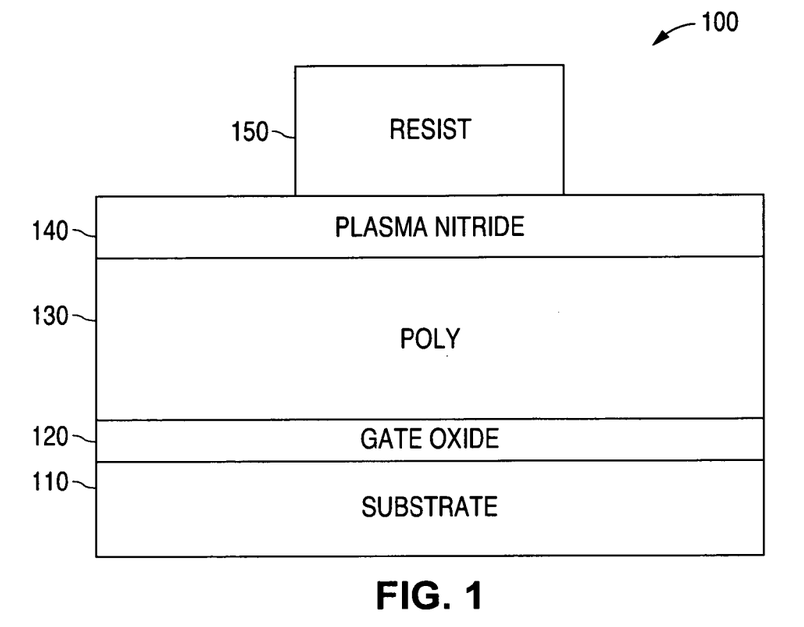
FIGS. 1 through 5 illustrate exemplary stages of manufacture of an embodiment of electronic device manufactured in accordance with the principles of the present invention.

FIG. 1 illustrates a structure 100 of an electronic device that comprises a substrate 110, a layer of gate oxide 120, a layer of poly 130, and a layer of plasma nitride 140. A resist mask 150 is formed on top of the layer of plasma nitride 140.

Figure 2:
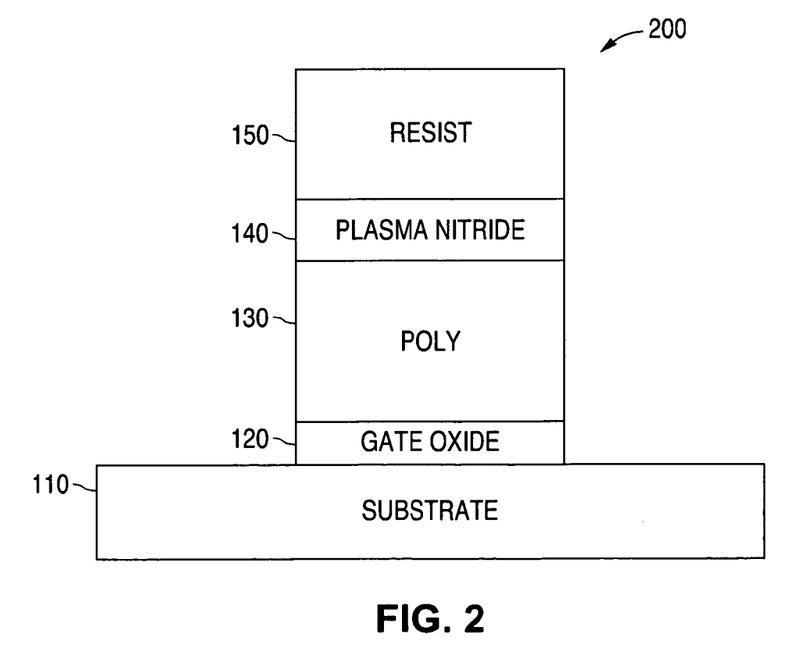

In the next step of the manufacturing method of the invention an etch procedure is performed to etch the exposed portions of plasma nitride layer 140 and the poly 130 and the gate oxide 120. The etch procedure stops on the substrate 110. The resulting structure 200 is shown in FIG. 2.

Figure 3:
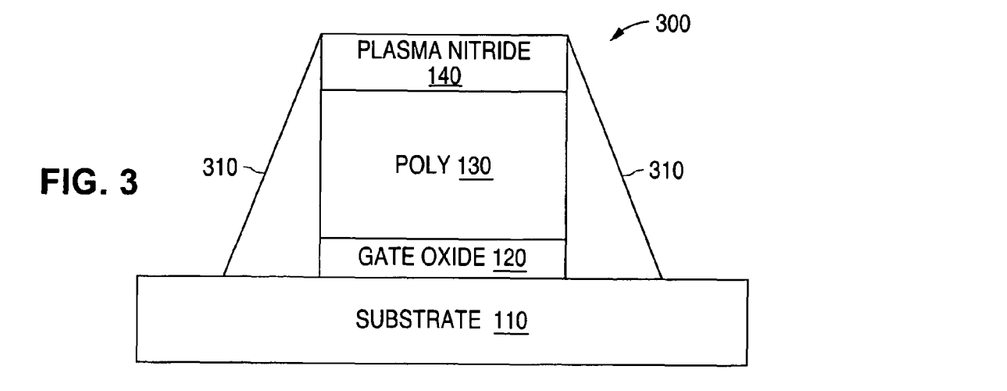

In the next step of the manufacturing method of the invention the resist mask 150 is removed. Then spacers 130 are formed on the sides of the remaining portions of plasma nitride 140, poly 130 and gate oxide 120. The resulting structure 300 is shown in FIG. 3.

Figure 4:
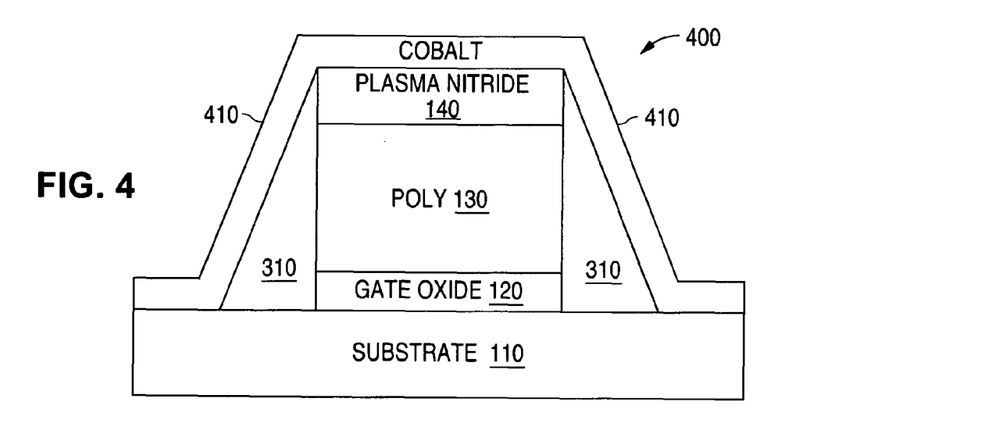

In the next step of the manufacturing method of the invention a layer of cobalt 410 is formed over the structure 300. The resulting structure 400 with the cobalt layer 410 is shown in FIG. 4.

Figure 5:
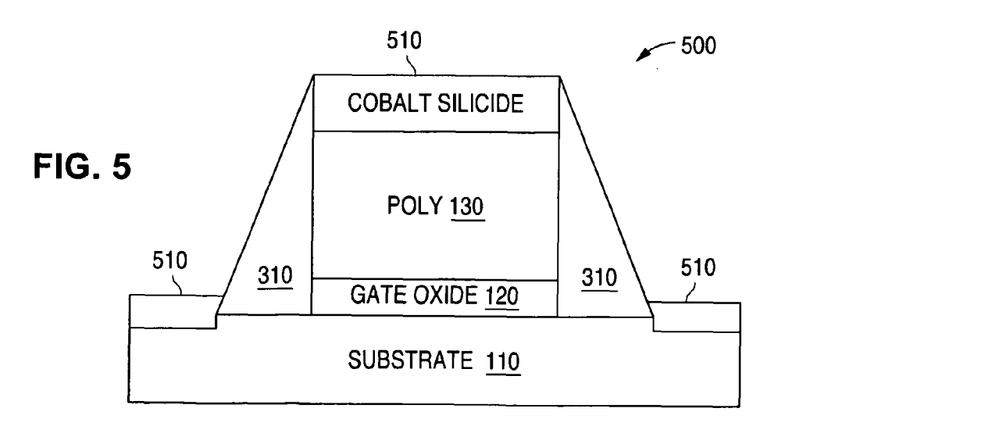

In the next step of the manufacturing method of the invention the cobalt layer 410 over the plasma nitride layer 140 is annealed. The annealing process causes the plasma nitride layer 140 to form cobalt silicide ($CoSi_2$) 510. The annealing process also causes the exposed portions of the substrate 110 to form cobalt silicide ($CoSi_2$) 510. The resulting structure 500 is shown in FIG. 5.

Figure 6:
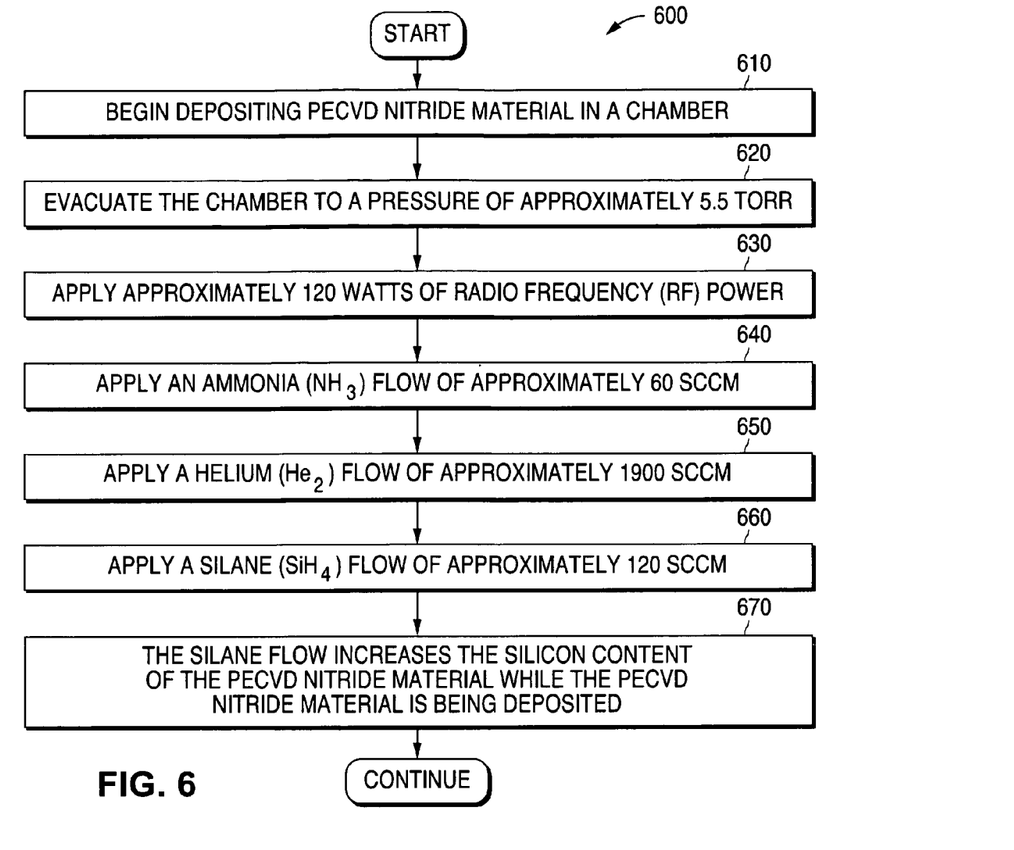
FIG. 6 illustrates a flow chart setting forth the steps of method of the present invention to increase the silicon content of a plasma enhanced chemical vapor deposition (PECVD) nitride material.

FIG. 6 illustrates a flow chart 600 that sets forth the steps of method of the present invention to increase the silicon content of a plasma enhanced chemical vapor deposition (PECVD) nitride material. In the first step of the method a deposition process is begun to deposit a plasma enhanced chemical vapor deposition (PECVD) nitride material in a chamber (step 610).

Although set forth sequentially in the flow chart the following steps occur substantially simultaneously. The chamber is evacuated to a pressure of approximately five and one half Torr (5.5 Torr) (step 620). Approximately one hundred twenty watts (120 W) of radio frequency (RF) power is applied (step 630). The plasma enhanced chemical vapor deposition (PECVD) nitride material is subjected to an ammonia ($HN_3$) flow of approximately sixty (60) sccm (step 640). The flow rate abbreviation "sccm" stands for "standard cubic centimeters per minute."

The plasma enhanced chemical vapor deposition (PECVD) nitride material is also subjected to a helium ($He_2$) flow of approximately one thousand nine hundred (1900) sccm (step 650). The plasma enhanced chemical vapor deposition (PECVD) nitride material is also subjected to a silane ($SiH_4$) flow of approximately one hundred twenty (120) sccm (step 660). The silane flow increases the silicon content of the plasma enhanced chemical vapor deposition (PECVD) nitride material while the PECVD nitride material is being deposited to form a silicon enhanced plasma nitride material (step 670). The increased silicon content aids in the subsequent silicidation process to which the plasma nitride material is subjected.

The silane flow of approximately one hundred twenty (120) sccm represents an increased level of silane flow when compared to prior art processes. Prior art processes use silane flows that have a flow rate of only sixty (60) sccm to seventy (70) sccm.

The rate of silane flow is the critical parameter for both (1) increasing the ability of the plasma nitride material to silicide, and (2) enhancing the anti-reflective properties of the plasma nitride material. The increased level of silane flow increases the silicon content in the plasma nitride material and increases the refractive index (RI) of the material.

Figure 7:
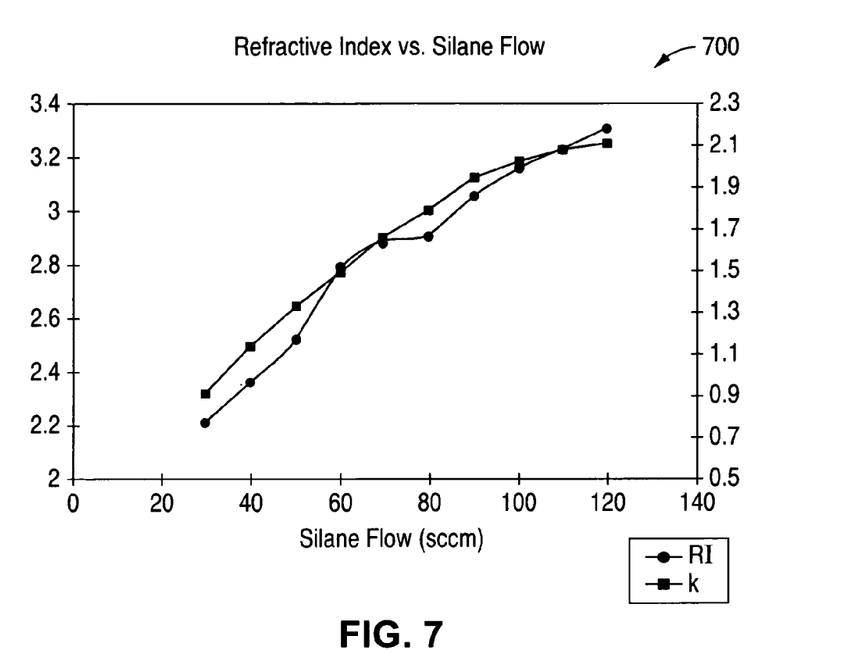
FIG. 7 illustrates a chart showing the refractive index of plasma nitride film versus silane flow.

Stoichiometric silicon nitride ($Si_3N_4$) has a refractive index of approximately two and twenty eight hundredths (2.28) at a wavelength of two hundred fifty eight nanometers (258 nm). A silane flow of approximately one hundred twenty (120) sccm increases the refractive index of the plasma nitride material to approximately three and three tenths (3.3). FIG. 7 illustrates a chart 700 that shows the refractive index (RI) of plasma nitride film versus silane flow. Increasing the silane flow increases the refractive index (RI) of the material. The vertical scale on the left of the graph in FIG. 7 represents the values for the refractive index (RI).

It has been determined that films of plasma nitride that have a value of refractive index (RI) that is greater than two and eight tenths (2.8) generally form cobalt silicide when covered with cobalt and subjected to a normal cobalt annealing process.

FIG. 7 also illustrates the increase of the extinction coefficient (k) of the plasma nitride film with increasing silane flow. The vertical scale on the right of the graph in FIG. 7 represents the values for the extinction coefficient (k).

Figure 8:
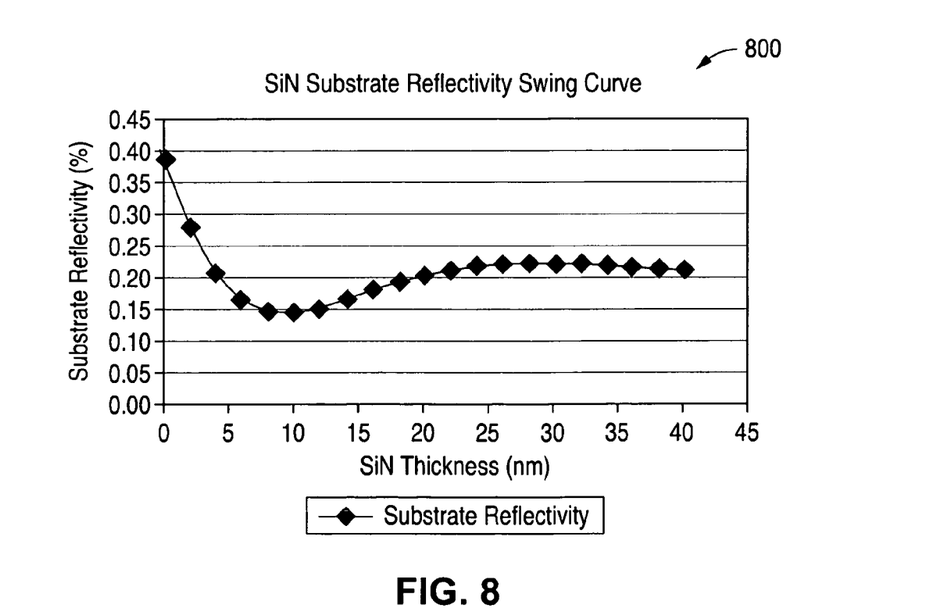
FIG. 8 illustrates a chart showing the reflectivity of a substrate with siliciding silicon nitride used as a top anti-reflective coating (ARC)

The plasma nitride material of the invention possesses the ability to act as an anti-reflective coating (ARC). FIG. 8 illustrates a chart 800 showing the reflectivity of a substrate in which plasma nitride material of the invention (i.e., siliciding silicon nitride) is used as a top anti-reflective coating (ARC). The vertical scale shows the substrate reflectivity as a percentage. The horizontal scale shows the thickness (in nanometers) of the silicon nitride (SiN) layer (i.e., the anti-reflective coating (ARC) layer).

Figure 9:
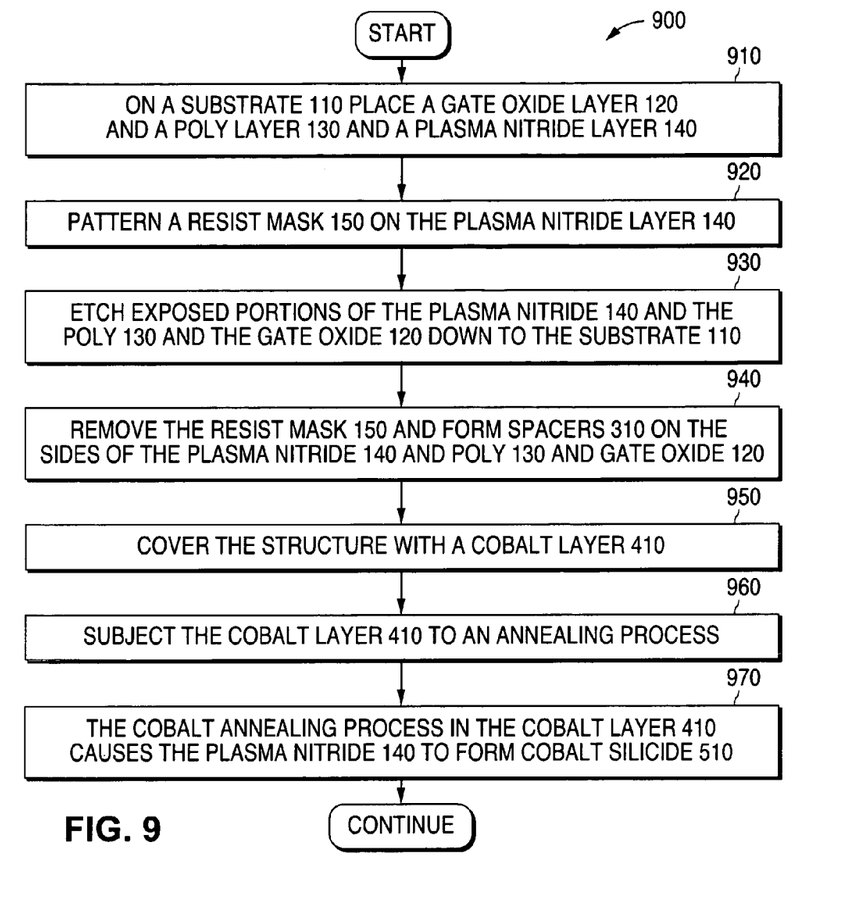
FIG. 9 illustrates a flow chart setting forth the steps of a first manufacturing method of the present invention.

FIG. 9 illustrates a flow chart 900 setting forth the steps of a first manufacturing method of the present invention. In the first step, a substrate 110 and a gate oxide layer 120 and a poly layer 130 and a plasma nitride layer 140 are formed as shown in FIG. 1 (step 910). Then a resist mask 150 is patterned on top of the layer of plasma nitride 140 as shown in FIG. 1 (step 920).

Then an etch procedure is performed to etch the exposed portions of plasma nitride layer 140 and the poly 130 and the gate oxide 120 down to the substrate 110 as shown in FIG. 2 (step 930). Then the resist mask 150 is removed and spacers 130 are formed on the sides of the plasma nitride 140, poly 130 and gate oxide 120 as shown in FIG. 3 (step 940). Then the resulting structure is covered with a layer of cobalt 410 as shown in FIG. 4 (step 950).

Then the cobalt layer 410 over the plasma nitride layer 140 is subjected to an annealing process (step 960). The cobalt annealing process causes the plasma nitride layer 140 to form cobalt silicide ($CoSi_2$) 510 as shown in FIG. 5 (step 970).

In addition to providing anti-reflective coating (ARC) capability, the plasma nitride material of the present invention can also function as a gate etch hard mask film. When exposed to standard polysilicon dry etch chemistry, the plasma nitride film of the present invention has a lower removal rate than the polysilicon.

There are several advantages to using a plasma nitride film of the present invention as a hard mask as part of a photolithographic etch pattern transfer strategy. A first advantage is that it reduces the post etch critical dimension (CD) dense-to-isolated bias. A second advantage is that it reduces the aspect ratio dependent etch (ARDE) effect. A third advantage is that it improves sidewall profiles due to the absence of photoresist material. A fourth advantage is that it relaxes the resist thickness requirements because the photoresist is only needed to define the hard mask.

When the plasma nitride film of the present invention is used as a hard mask, the anti-reflective coating (ARC) properties of the plasma nitride material make it unnecessary to apply an additional anti-reflective coating (ARC) film. Most prior art hard masks (e.g., silicon dioxide ($SiO_2$), silicon nitride ($Si_3N_4$)) require the use of an anti-reflective coating (ARC) layer to reduce the impact on the photolithography imaging process. An additional anti-reflective coating (ARC) layer is not necessary with the plasma nitride film of the present invention.

Another advantage of using the plasma nitride film of the present invention as a hard mask is that the hard mask film does not need to be removed after the poly gate processing. The plasma nitride hard mask film remains and becomes part of the cobalt silicide process.

FIGS. 10 through 16 illustrate exemplary stages of manufacture of an embodiment of an electronic device manufactured in accordance with the principles of the present invention.

Figure 10:
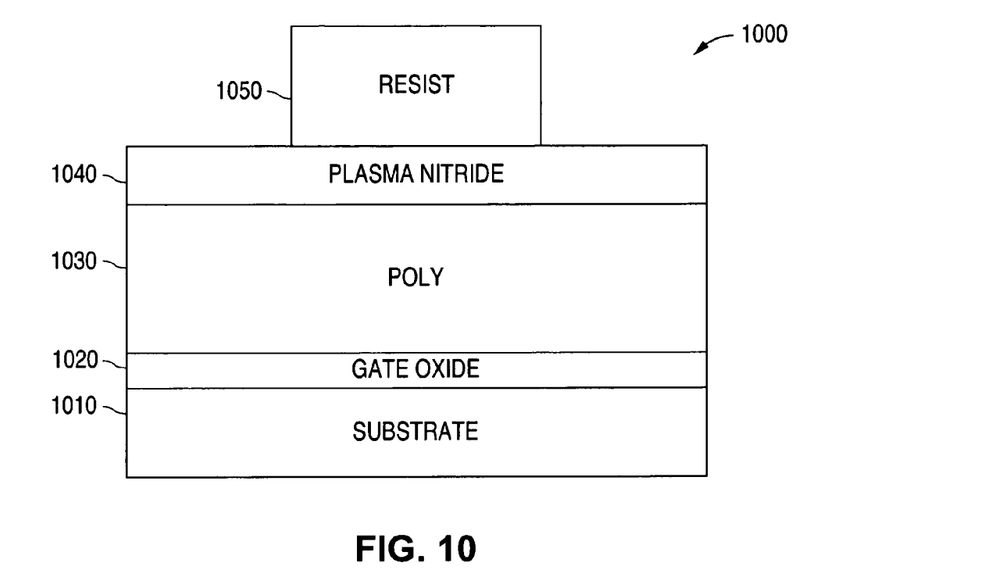
FIGS. 10 through 16 illustrate exemplary stages of manufacture of an embodiment of an electronic device manufactured in accordance with the principles of the present invention.

FIG. 10 illustrates a structure 1000 of an electronic device that comprises a substrate 1010, a layer of gate oxide 1020, a layer of poly 1030, and a layer of plasma nitride 1040. A resist mask 1050 is formed on top of the layer of plasma nitride 1040.

Figure 11:
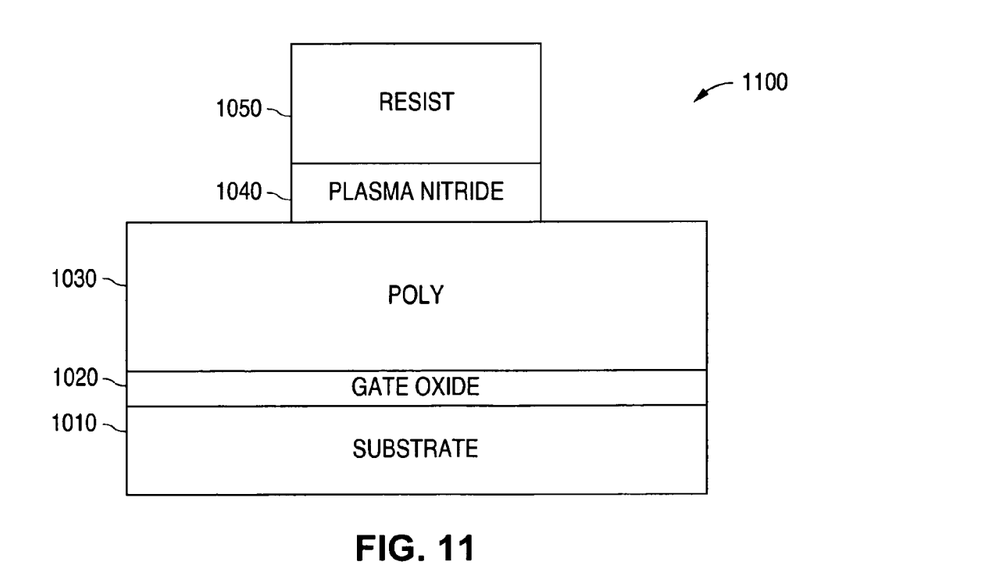

In the next step of the manufacturing method of the invention an etch procedure is performed to etch the exposed portions of plasma nitride layer 1040. The etch procedure stops on the poly layer 1030. The resulting structure 1100 is shown in FIG. 11.

Figure 12:
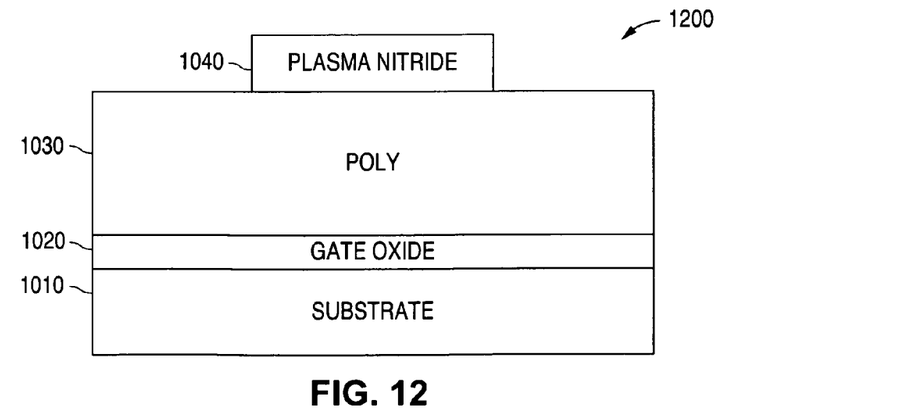

In the next step of the manufacturing method of the invention the resist mask 1050 is removed. The resulting structure 1200 is shown in FIG. 12. The plasma nitride 1040 that remains functions as a hard mask 1040. The removal of the resist mask 1050 is an optional step. The resist mask 1050 may be left in place if desired.

Figure 13:
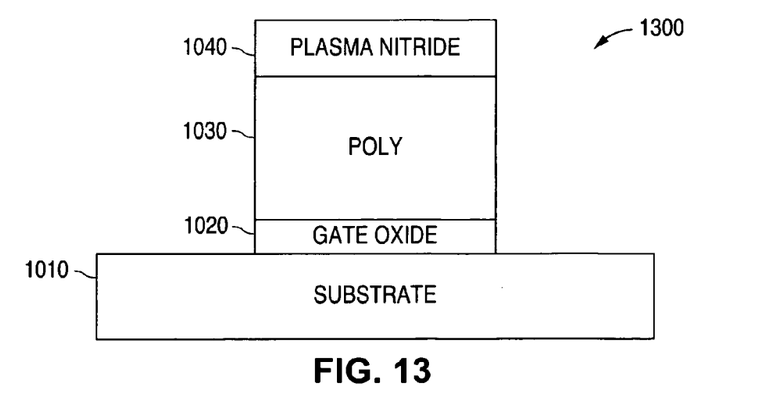

In the next step of the manufacturing method of the invention an etch procedure is performed to etch the exposed portions of the poly layer 1030 and the gate oxide layer 1020. The etch procedure stops on the substrate 1010. The resulting structure 1300 is shown in FIG. 13.

Figure 14:
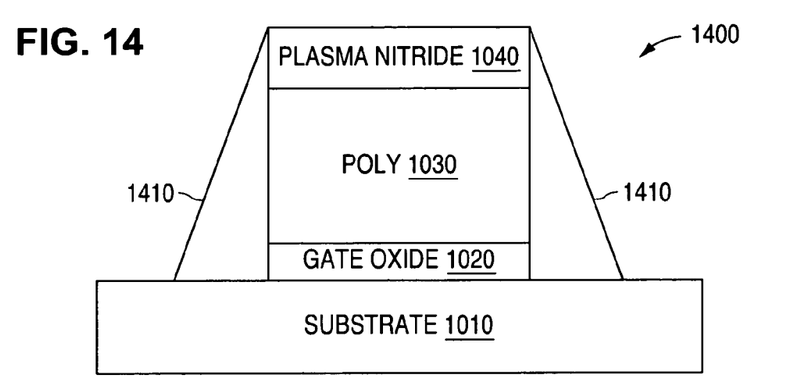

Then spacers 1410 are formed on the sides of the remaining portions of plasma nitride 1040, poly 1030 and gate oxide 1020. The resulting structure 1400 is shown in FIG. 14.

Figure 15:
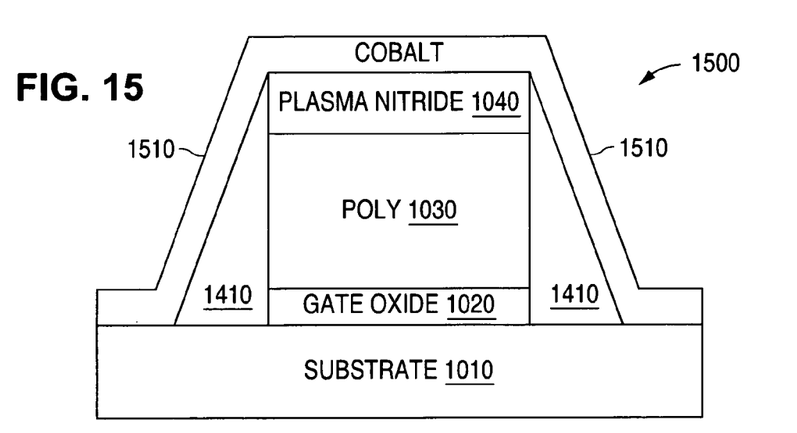

In the next step of the manufacturing method of the invention a layer of cobalt 1510 is formed over the structure 1400. The resulting structure 1500 with the cobalt layer 1510 is shown in FIG. 15.

Figure 16:
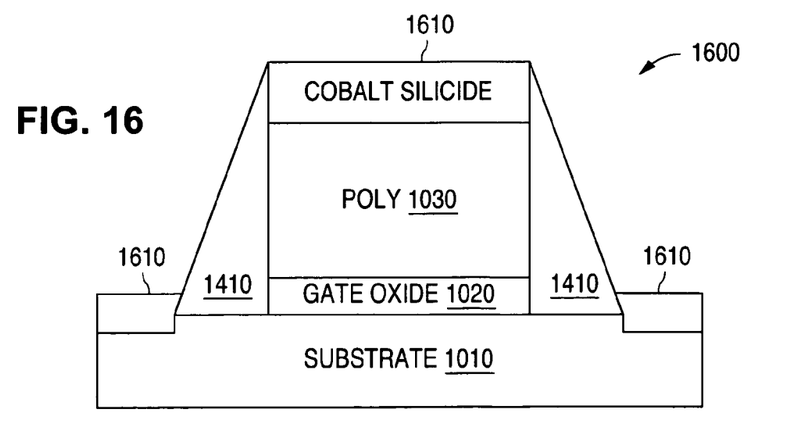

In the next step of the manufacturing method of the invention the cobalt layer 1510 over the plasma nitride layer 1040 is annealed. The annealing process causes the plasma nitride layer 1040 to form cobalt silicide ($CoSi_2$) 1610. The annealing process also causes the exposed portions of the substrate 1010 to form cobalt silicide ($CoSi_2$) 1610. The resulting structure 1600 is shown in FIG. 16.

Figure 17:
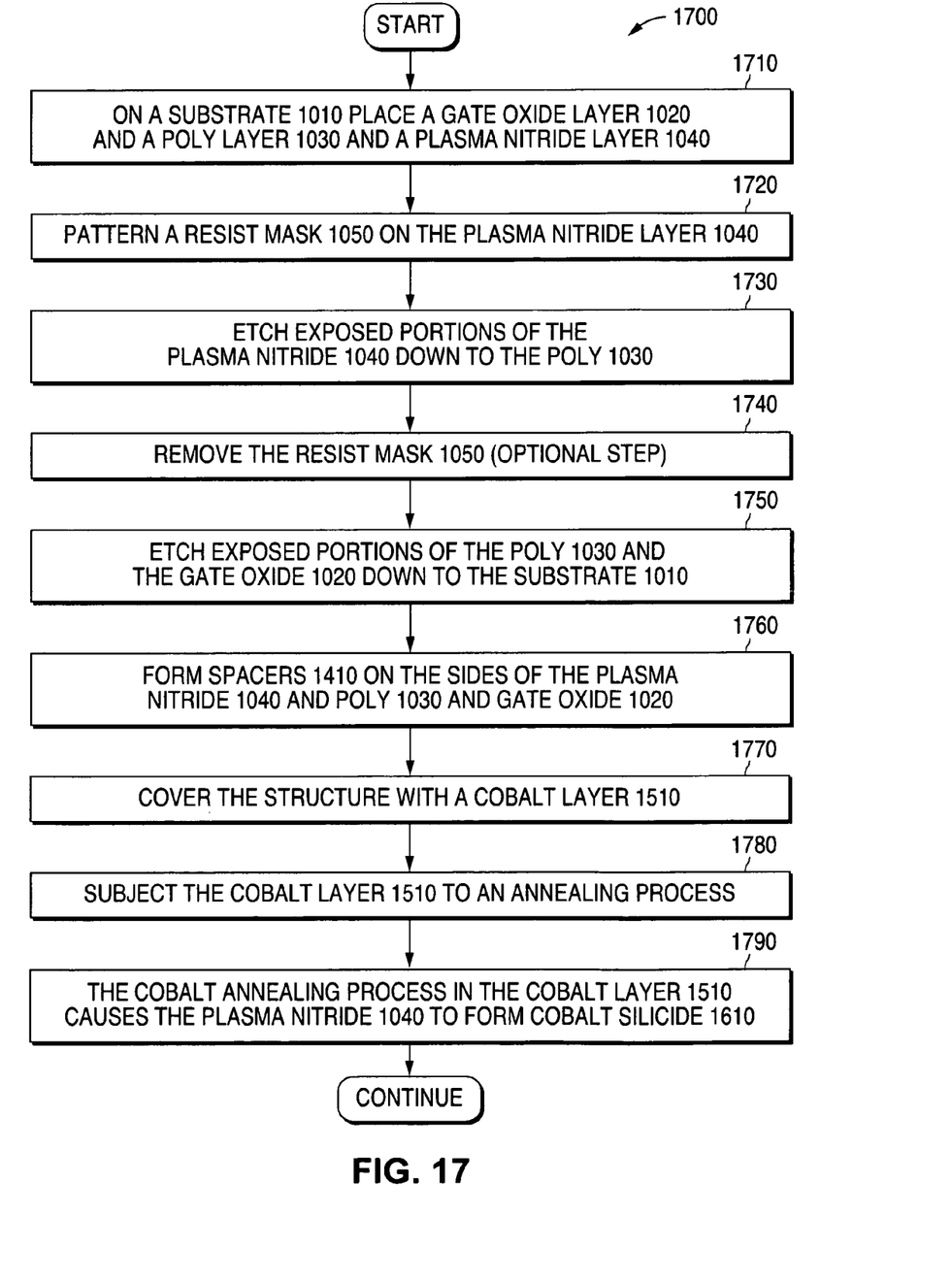
FIG. 17 illustrates a flow chart setting forth the steps of a second manufacturing method of the present invention.

FIG. 17 illustrates a flow chart 1700 setting forth the steps of a second manufacturing method of the present invention. In the first step, a substrate 1010 and a gate oxide layer 1020 and a poly layer 1030 and a plasma nitride layer 1040 are formed as shown in FIG. 10 (step 1710). Then a resist mask 1050 is patterned on top of the layer of plasma nitride 1040 as shown in FIG. 10 (step 1720).

Then an etch procedure is performed to etch the exposed portions of plasma nitride layer 1040 down to the poly layer 1030 as shown in FIG. 11 (step 1730). Then the resist mask 1050 is removed (step 1740). The removal of the resist mask 1050 is an optional step.

Then an etch procedure is performed to etch the exposed portions of poly layer 1030 and the gate oxide layer 1020 down to the substrate 1010 as shown in FIG. 13 (step 1750). Then spacers 1410 are formed on the sides of the plasma nitride 1040, poly 1030 and gate oxide 1020 as shown in FIG. 14 (step 1760). Then the resulting structure is covered with a layer of cobalt 1510 as shown in FIG. 15 (step 1770).

Then the cobalt layer 1510 over the plasma nitride layer 1040 is subjected to an annealing process (step 1780). The cobalt annealing process causes the plasma nitride layer 1040 to form cobalt silicide ($CoSi_2$) 1610 as shown in FIG. 16 (step 1790).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for increasing a silicon content of a plasma enhanced chemical vapor deposition (PECVD) silicon nitride material to create a plasma nitride material, the method comprising the steps of:
   depositing the PECVD silicon nitride material in a chamber;
   exposing the PECVD silicon nitride material to a flow of silane during the deposition of the PECVD silicon nitride material to form the plasma nitride material; covering the plasma nitride material with cobalt;
   annealing the cobalt; and
   converting the plasma nitride material to cobalt silicide;
   wherein the flow of silane during the deposition of the PECVD silicon nitride material has a flow rate of approximately one hundred twenty standard cubic centimeters per minute.

2. The method as set forth in claim 1, further comprising the steps of:
   evacuating the chamber to a pressure of approximately five and one half Torr;
   applying approximately one hundred twenty (120) watts of radio frequency power to the chamber;
   applying an ammonia flow of approximately sixty standard cubic centimeters per minute to the PECVD silicon nitride material; and
   applying a helium flow of approximately one thousand nine hundred standard cubic centimeters per minute to the PECVD silicon nitride material.

3. The method as set forth in claim 1, wherein the exposure to the flow of silane increases a refractive index of the PECVD silicon nitride material to approximately three and three tenths.

4. The method as set forth in claim 1, further comprising the step of:
   using the plasma nitride material as an anti-reflective coating (ARC) material that is not removed before subsequent processing steps are performed.

5. The method as set forth in claim 1, further comprising the step of:
   using the plasma nitride material as a hard mask material that is not removed before subsequent processing steps are performed.

6. A method for manufacturing an electronic apparatus, the method comprising the steps of:
   forming a substrate layer;
   forming a polysilicon layer over the substrate layer;
   forming a plasma nitride layer polysilicon layer;
   covering the plasma nitride layer with cobalt;
   annealing the cobalt; and
   converting the plasma nitride layer to cobalt silicide;

wherein the step of forming the plasma nitride layer comprises the steps of:
  depositing a plasma enhanced chemical vapor deposition (PECVD) silicon nitride material in a chamber;
  evacuating the chamber to a pressure of approximately five and one half Torr;
  applying approximately one hundred twenty (120) watts of radio frequency power to the chamber;
  applying an ammonia flow of approximately sixty standard cubic centimeters per minute to the PECVD silicon nitride material;
  applying a helium flow of approximately one thousand nine hundred standard cubic centimeters per minute to the PECVD silicon nitride material; and
  applying a silane flow of approximately one hundred twenty standard cubic centimeters per minute to the PECVD silicon nitride material;
  wherein the silane flow increases a silicon content of the PECVD silicon nitride material to form the plasma nitride layer.

7. The method as set forth in claim 6, further comprising the step of:
  using the plasma nitride layer as an anti-reflective coating (ARC) layer that is not removed before subsequent processing steps are performed.

8. The method as set forth in claim 6, further comprising the step of:
  using the plasma nitride layer as a hard mask material that is not removed before subsequent processing steps are performed.

9. The method as set forth in claim 6, further comprising the steps of:
  forming a resist mask on the plasma nitride layer;
  etching portions of the plasma nitride layer and the polysilicon layer not under the resist mask down to the substrate layer;
  removing the resist mask from the plasma nitride layer; and
  forming spacers around the plasma nitride layer and the polysilicon layer.

10. The method as set forth in claim 6 further comprising the steps of:
  forming a resist mask on the plasma nitride layer;
  etching portions of the plasma nitride layer not under the resist mask down to the polysilicon layer;
  removing the resist mask from the plasma nitride layer;
  etching portions of the polysilicon layer not under the plasma nitride layer down to the substrate layer; and
  forming spacers around the plasma nitride layer and the polysilicon layer.

11. A method comprising:
  forming a plasma nitride material by exposing a plasma enhanced chemical vapor deposition (PECVD) silicon nitride material to silane during deposition of the PECVD silicon nitride material;
  depositing cobalt on the plasma nitride material;
  annealing the cobalt; and
  converting at least a portion of the plasma nitride material to cobalt silicide.

12. The method of claim 11, wherein the exposure to the silane increases a refractive index of the PECVD silicon nitride material to approximately 3.3.

13. The method of claim 11, wherein exposing the PECVD silicon nitride material to the silane comprises providing the silane to a deposition chamber at a flow rate of approximately 120 standard cubic centimeters per minute.

14. The method of claim 3, further comprising:
  evacuating the chamber to a pressure of approximately 5.5 Torr.

15. The method of claim 13, further comprising:
  applying approximately 120 watts of radio frequency power to the chamber.

16. The method of claim 13, further comprising:
  applying an ammonia flow of approximately 60 standard cubic centimeters per minute to the PECVD silicon nitride material.

17. The method of claim 13, further comprising:
  applying a helium flow of approximately 1,900 standard cubic centimeters per minute to the PECVD silicon nitride material.

18. The method of claim 11, further comprising:
  forming a polysilicon layer over the semiconductor substrate;
  wherein the plasma nitride material is formed over the polysilicon layer.

19. The method of claim 18, further comprising:
  forming a resist mask on the plasma nitride material;
  etching portions of the plasma nitride material and the polysilicon layer not under the resist mask down to the semiconductor substrate;
  removing the resist mask from the plasma nitride material; and
  forming spacers around the plasma nitride material and the polysilicon layer.

20. The method of claim 18, further comprising:
  forming a resist mask on the plasma nitride material;
  etching portions of the plasma nitride material not under the resist mask down to the polysilicon layer;
  removing the resist mask from the plasma nitride material;
  etching portions of the polysilicon layer not under the plasma nitride material down to the semiconductor substrate; and
  forming spacers around the plasma nitride material and the polysilicon layer.

* * * * *